(12) United States Patent
Boulos et al.

(10) Patent No.: US 7,964,247 B2
(45) Date of Patent: Jun. 21, 2011

(54) PROCESS AND APPARATUS FOR THE MANUFACTURE OF A SPUTTERING TARGET

(75) Inventors: Maher I. Boulos, Sherbrooke (CA); Jerzy W. Jurewicz, Sherbrooke (CA)

(73) Assignee: Tekna Plasma Systems, Inc., Quebec (CA)

( * ) Notice: Subject to any disclaimer, the term of this patent is extended or adjusted under 35 U.S.C. 154(b) by 1244 days.

(21) Appl. No.: 10/546,639

(22) PCT Filed: Feb. 23, 2004

(86) PCT No.: PCT/CA2004/000251
§ 371 (c)(1), (2), (4) Date: May 22, 2006

(87) PCT Pub. No.: WO2004/074540
PCT Pub. Date: Sep. 2, 2004

(65) Prior Publication Data
US 2006/0233965 A1  Oct. 19, 2006

Related U.S. Application Data

(60) Provisional application No. 60/448,867, filed on Feb. 24, 2003.

(51) Int. Cl.
*B05D 1/08* (2006.01)
(52) U.S. Cl. .................................. 427/446; 204/298.12
(58) Field of Classification Search ............... 427/446; 204/298.12
See application file for complete search history.

(56) References Cited

U.S. PATENT DOCUMENTS

| | | | | | |
|---|---|---|---|---|---|
| 3,547,720 A | * | 12/1970 | Jones | ............................. | 156/82 |
| 4,120,930 A | * | 10/1978 | Lemelson | ..................... | 264/225 |
| 4,908,261 A | * | 3/1990 | Ishii et al. | ..................... | 428/216 |

(Continued)

FOREIGN PATENT DOCUMENTS

DE  41 15 663  11/1992

(Continued)

OTHER PUBLICATIONS

DE4115663 (machine translation).*

(Continued)

*Primary Examiner* — Michael Cleveland
*Assistant Examiner* — Robert Vetere
(74) *Attorney, Agent, or Firm* — Venable LLP; Robert Kinberg; Lars H. Genieser

(57) ABSTRACT

A process for the manufacture of sputtering target comprises the steps of i) providing a substrate; ii) plasma melting of a material selected to form the sputtering target, yielding droplets of molten material; and iii) deposition of the droplets onto the substrate, yielding a sputtering target comprised of the coated layer of the material on the substrate. In some application, it might be preferable that the substrate be a temporary substrate and iv) to join the coated temporary target via its coated layer to a permanent target backing material; and v) to remove the temporary substrate, yielding a sputtering target comprised of the coated layer of the material on the permanent target backing material. The plasma deposition step is carried out at atmospheric pressure or under soft vacuum conditions using, for example, d.c. plasma spraying, d.c. transferred arc deposition or induction plasma spraying. The process is simple and does not require subsequent operation on the resulting target.

20 Claims, 10 Drawing Sheets

U.S. PATENT DOCUMENTS

| | | | | |
|---|---|---|---|---|
| 4,934,049 A | * | 6/1990 | Kiekhafer et al. | 29/883 |
| 5,338,425 A | * | 8/1994 | Mishima et al. | 204/298.12 |
| 5,356,674 A | * | 10/1994 | Henne et al. | 427/449 |
| 5,709,783 A | * | 1/1998 | Sanchez et al. | 156/89.12 |
| 5,744,777 A | * | 4/1998 | Bernecki et al. | 219/121.47 |
| 6,193,856 B1 | * | 2/2001 | Kida et al. | 204/192.22 |
| 7,175,802 B2 | * | 2/2007 | Sandlin et al. | 419/8 |
| 2005/0208218 A1 | * | 9/2005 | Becker et al. | 427/248.1 |

FOREIGN PATENT DOCUMENTS

| | | |
|---|---|---|
| EP | 0 522 369 | 1/1993 |
| EP | 1 350 861 | 10/2003 |
| GB | 1 410 169 | 10/1975 |

OTHER PUBLICATIONS

DE 4115663 (machine translation) (1992).*

Anonymous: "Process for Fabricating Sputtering Targets", Research Disclosure, Kenneth Mason Publications, Hampshire, GB, vol. 300, No. 82, Apr. 1989.

Patent Abstracts of Japan, vol. 1995, No. 03, Apr. 28, 1995.

Patent Abstracts of Japan, vol. 0120, No. 05 (C-467).

Anonymous: "Process for Fabricating Sputtering Targets", Research Disclosure, Kenneth Mason Publications, Hampshire, GB, vol. 300, No. 82, Apr. 1989.

Patent Abstracts of Japan, vol. 1995, No. 03, Apr. 28, 1995.

Patent Abstracts of Japan, vol. 0120, No. 05 (C-467) (1988).

* cited by examiner

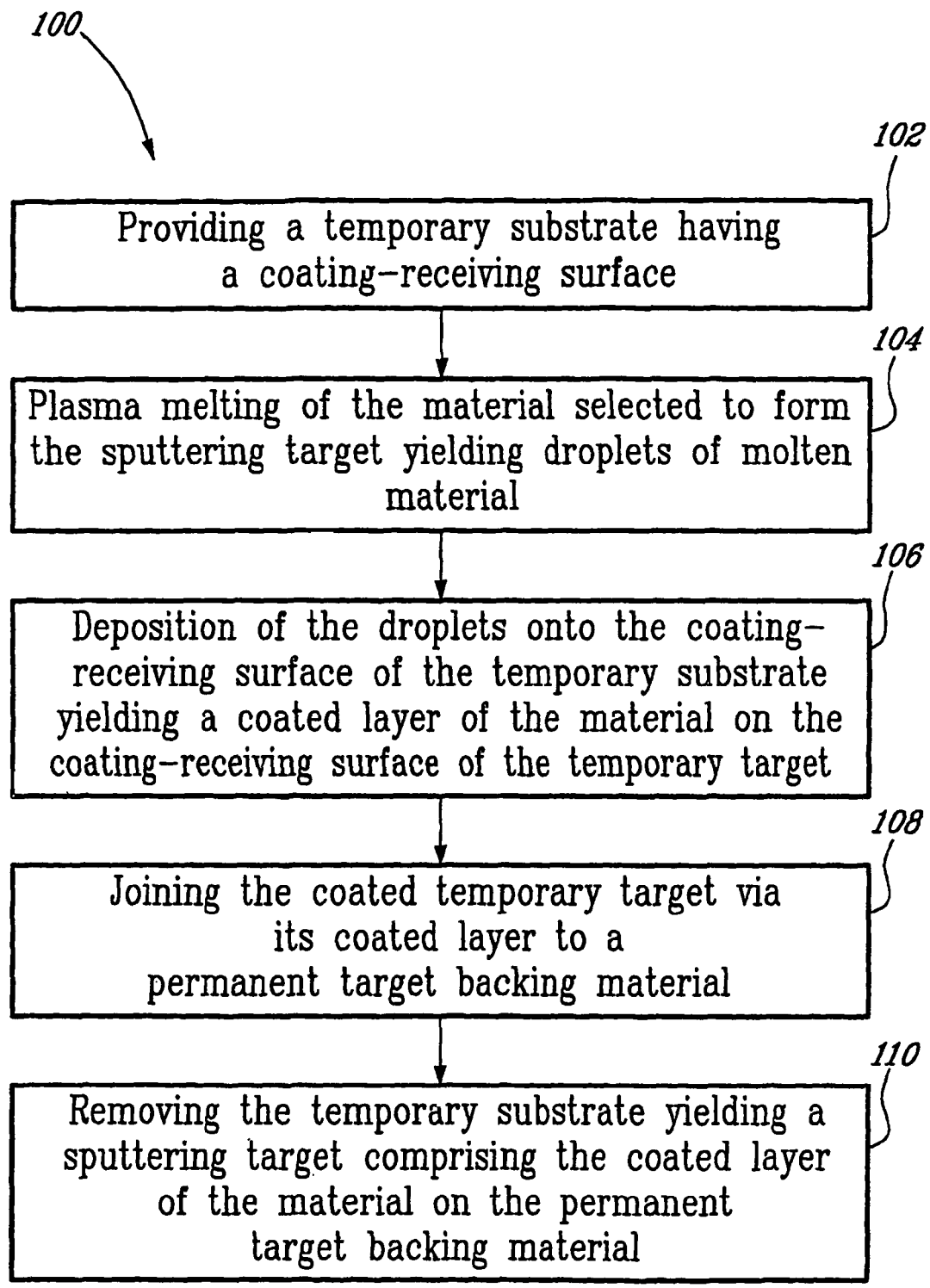

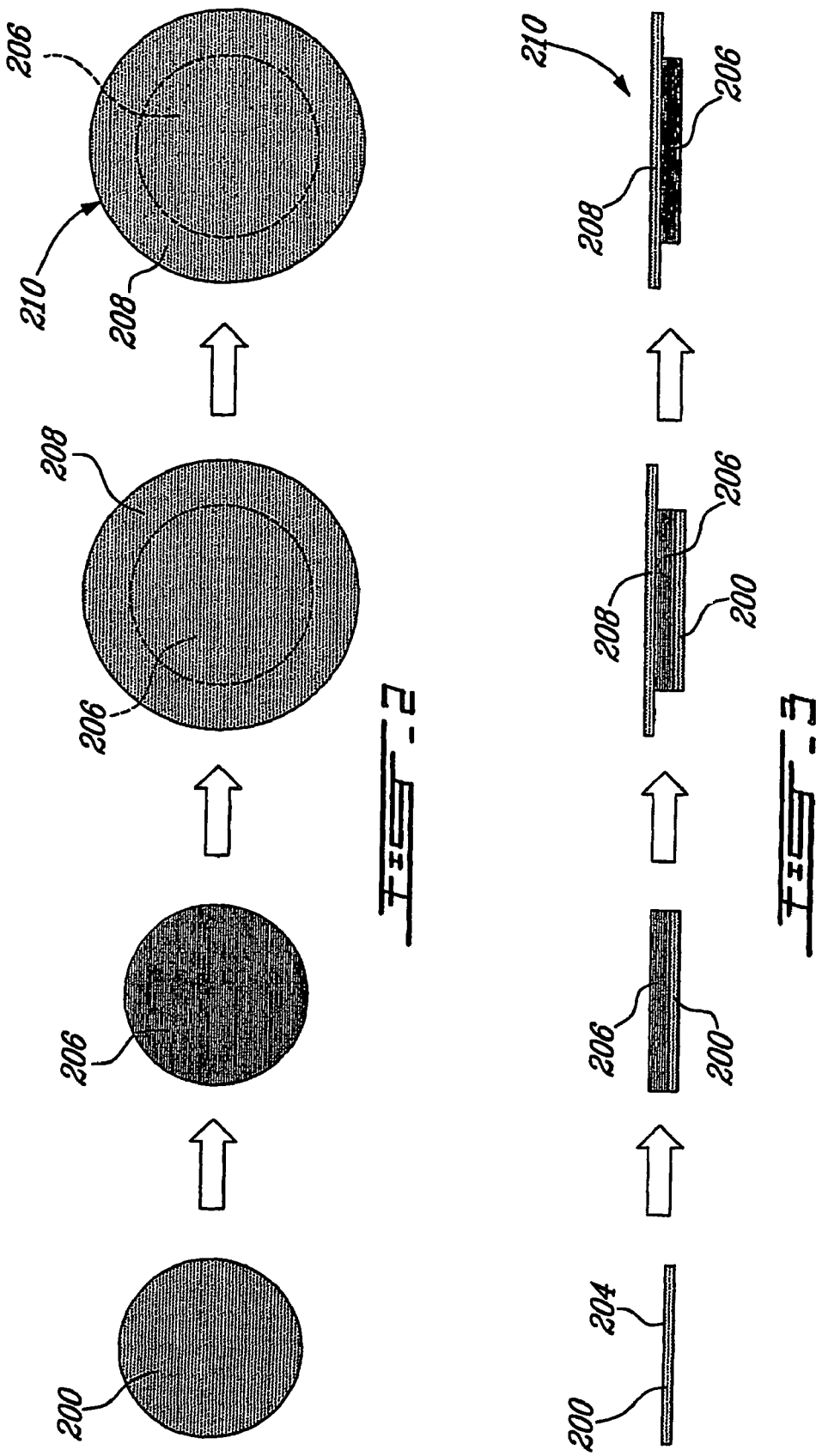

PROCESS AND APPARATUS FOR THE MANUFACTURE OF A SPUTTERING TARGET

FIELD OF THE INVENTION

The present invention relates to sputtering targets. More specifically, the present invention is concerned with a process for the manufacture of sputtering targets and with an apparatus therefore.

BACKGROUND OF THE INVENTION

Sputtering targets are essential components in the thin film coating industry. They are used as a source of high purity materials, which are released from the target surface as a result of its bombardment with energetic projectile particles such as an ion beam. The particles that are released, in the form of vapours, are subsequently directed towards the surface of a substrate where they are deposited in the form of a thin film of controlled thickness and purity. The most striking characteristic of the sputtering process is its universality. Virtually any material can be a coating candidate since it is passed into the vapour phase by a physical momentum-exchange rather than a chemical or thermal process.

Thin film deposition using sputtering techniques is an essential step in a wide range of applications such as aluminium alloy and refractory metal microcircuit metallization layers, microcircuit insulation layer, transparent conduction electrodes, amorphous optical film for integrated optics devices, piezo-electric transducers, photoconductors and luminescent film for displays, optically addressed memory devices, amorphous bubble memory devices, thin film resistors and capacitors, video discs, solid electrolytes, thin film laser and microcircuit photolithographic mask blanks.

Target materials vary depending on the application. They can be formed of pure metals such as aluminium, copper, iron, silver, chromium, silicon, tantalum, gold, platinum, rhenium; alloys and compounds, such as cadmium sulfate, gallium arsenate, gallium phosphate; a wide range of ceramics such as silica, alumina, silicon carbide; polymers such as PTFE (Teflon™); or even a mosaic of different materials. The performance of the target is strongly dependant on the purity of the target material, its apparent density and microstructure.

Sputtering targets have traditionally been manufactured through the use of different powder metallurgical techniques for the formation of the target plate made of high purity materials, which are subsequently mounted on the target backing material for proper heat management under its final operating conditions. The technique is relatively tedious and requires a number of steps for the powder preparation and densification, followed by powder compaction at room temperature and subsequent sintering to the required high-density level. In certain cases, room temperature compaction is not sufficient to achieve the required density of the final product. In such cases, it is necessary to resort to the considerably more complex and expensive Hot Iso-static Pressing (HIP) sintering techniques.

OBJECTS OF THE INVENTION

An object of the present invention is therefore to provide improved process and apparatus for the manufacture of sputtering targets.

SUMMARY OF THE INVENTION

The present invention deals with a novel technique that can be used for the production of sputtering targets in a series of simple steps using plasma spraying/deposition technology.

According to a first aspect of the present invention, there is provided a process for the manufacturing of sputtering targets through the plasma deposition of the target material directly on the target support, or on a temporary substrate, from which the deposit is latter transferred to the final baking of the target material.

More specifically, in accordance with a first aspect of the present invention, there is provided a process for the manufacture of a sputtering target comprising:
  i) providing a substrate having a coating-receiving surface;
  ii) plasma melting in-flight of a target material selected to form the sputtering target in powder form, yielding droplets of molten target material; and
  iii) deposition of the droplets onto said coating-receiving surface of the substrate, yielding a sputtering target comprised of a coated layer of the target material on the coating-receiving surface of the substrate.

The deposited target material can be, for example, a metal, or an intermetalic alloy, a ceramic, a mosaic of different metals and/or mixture of metals and ceramics, or a polymer.

The plasma deposition step is carried out at atmospheric pressure or under soft vacuum conditions using, for example, d.c. plasma spraying, d.c. transferred arc deposition or induction plasma spraying.

More specifically, in accordance with a second aspect of the present invention, there is provided an apparatus for the manufacture of a sputtering target comprising:
  a plasma torch for melting of a material selected to form the sputtering target, yielding droplets of molten material and for deposition of these droplets onto a coating-receiving surface of a substrate, yielding a sputtering target comprised of a coated layer of the material on the coating-receiving surface of said substrate.

Other objects, advantages and features of the present invention will become more apparent upon reading the following non restrictive description of preferred embodiments thereof, given by way of example only with reference to the accompanying drawings.

BRIEF DESCRIPTION OF THE DRAWINGS

In the appended drawings:

FIG. 1 is flowchart of a process for the manufacture of sputtering targets according to an illustrative embodiment of the present invention;

FIG. 2 is a schematic side elevation view illustrating the various steps from FIG. 1;

FIG. 3 is a schematic top plan view illustrating the various steps from FIG. 1;

DETAILED DESCRIPTION OF THE INVENTION

Figure 4:
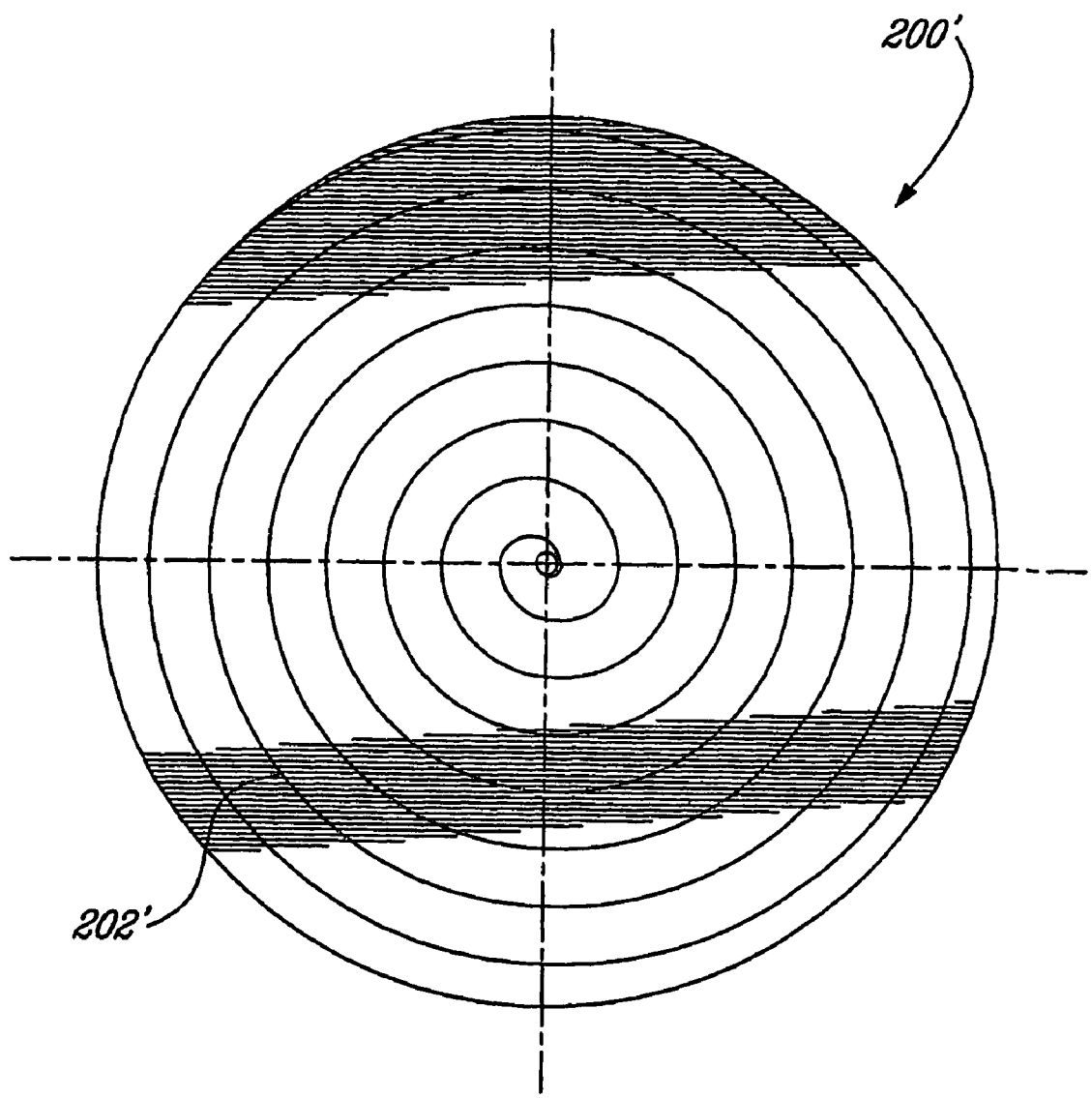
FIG. 4 is a schematic top plan view of a temporary substrate according to a second illustrative embodiment of the present invention.

A process 100 for the manufacture of sputtering targets according to an illustrative embodiment of a first aspect the present invention will now be described with reference to FIGS. 1-3.

As illustrated in FIG. 1, the process 100 includes the following steps:

102—providing a temporary substrate 200 having a coating-receiving surface 204;

104—plasma melting of the material selected to form the sputtering target, yielding droplets of molten material;

106—deposition of the droplets onto the coating-receiving surface 204 of the temporary substrate 200, yielding a coated layer 206 of the material on the coating-receiving surface 204 of the temporary target 200;

108—joining the coated temporary target via its coated layer 206 to a permanent target backing material 208; and 110—removing the temporary substrate 200, yielding a sputtering target 210 comprising the coated layer of the material 206 on the permanent target backing material 208.

Each of these steps will now be described in more detail with reference to FIGS. 2 and 3.

In step 102, a temporary substrate 200 having a coating-receiving surface 204 is provided (see first step on FIGS. 2 and 3). Even though the temporary substrate 200 is illustrated in FIGS. 2 and 3 as being a flat disk having two opposite sides, one being a coating-receiving side 204, the temporary substrate can have other shape providing a coating-receiving surface.

Proper selection of the temporary substrate material and control of its temperature during the deposition step 106 allows minimizing internal stresses and cracks in the target material 206 to be deposited (steps 104-106). Examples of substrate materials that can be used include: refectory metals such as molybdenum or tungsten; ceramics such as silica, alumina, zirconia, silicon nitride, silicon carbide or boron nitride; or graphite or carbon-based composite materials.

The temporary substrate material is selected for resistance to the high temperature involved in the deposition process and so as to have a coefficient of thermal expansion similar to the one of the target material. Whenever the coefficients of thermal expansion of the target material 206 and that of the temporary substrate 200 are too different, it has been found that providing the substrate materials with markings allows to minimize the development of internal stresses into the deposit. Such a temporary substrate 200' including spiral markings 202' is illustrated in FIG. 4 of the appended drawings. The markings can have many forms, such as spiral or radial cuts or sections giving the substrate 200' a sufficient level of flexibility to avoid the development of internal stresses in the deposited coating 206.

In certain application, the temporary substrate 100 is pre-coated by a thin diffusion barrier, or non-sticking, control layer of an inert material in order to facilitate the sub-sequential removal of the target material 206 from the temporary substrate 200 and/or avoid the contamination of the deposited target material 206 due to diffusion between the temporary substrate 200 into the deposited target material 206. The use of standard sputtering techniques or Chemical Vapor Deposition (CVD) techniques for the deposition of such an adhesion/diffusion-control layer (not shown) could be effectively used for such a purpose. The proper control of the surface finish of the substrate 200 could also allow for the easy removal of the target material 206 from the substrate 200 without sacrificing the substrate 200 which could be reused in these cases for further target material deposition.

The process 100 then includes the plasma melting of the material selected to form the sputtering target, which yields droplets of molten material (step 104) and then the deposition of those droplets onto the coating-receiving surface 204 of the temporary substrate 200 (step 106). The deposit 206 is built up to thickens of a coated layer of the material 206 require by the sputtering target application, as illustrated in the second step illustrated in both FIGS. 2 and 3.

Once the coating-formation step 106 has been completed, the resulting target plate 206 with its temporary support 200 is joint to a permanent target backing material 208 (step 108) via its coated layer 206, as illustrated in the third step of FIGS. 2 and 3, using either soldering, epoxy or other appropriate bonding means or techniques.

A heat treatment of the target material deposit 206 can be performed before the soldering step 108 onto the permanent target material support 208 in order to relief the deposited target material 206 from internal stresses. Alternatively, the target material deposit 206 can be provided with stress relieving markings similarly to those described hereinabove with reference to the temporary substrate 200.

The temporary substrate 200 is then removed for example by etching, by machining it off (step 110) or using another material removing method, yielding a sputtering target 210.

The surface of the target 210 can then be appropriately finished through grinding and polishing, for example.

In some applications, the plasma deposition of the material 206 can be executed directly onto the permanent target backing material 208. Of course, in those cases, steps 108-110 of method 100 are not performed. An application of the process 100 can in this particular case be the rebuilding of used and depleted targets.

In cases where the deposit steps 104-106 are performed directly on the target support 208, thermal protection of the target support 208 is provided during these steps. For example, target support 208 can be made of molybdenum or of an appropriate refractory material that would allow for the deposition of the target material 206 on the hot substrate 208.

Steps 104-106 are achieved using a plasma spraying/deposition apparatus.

Figure 5:
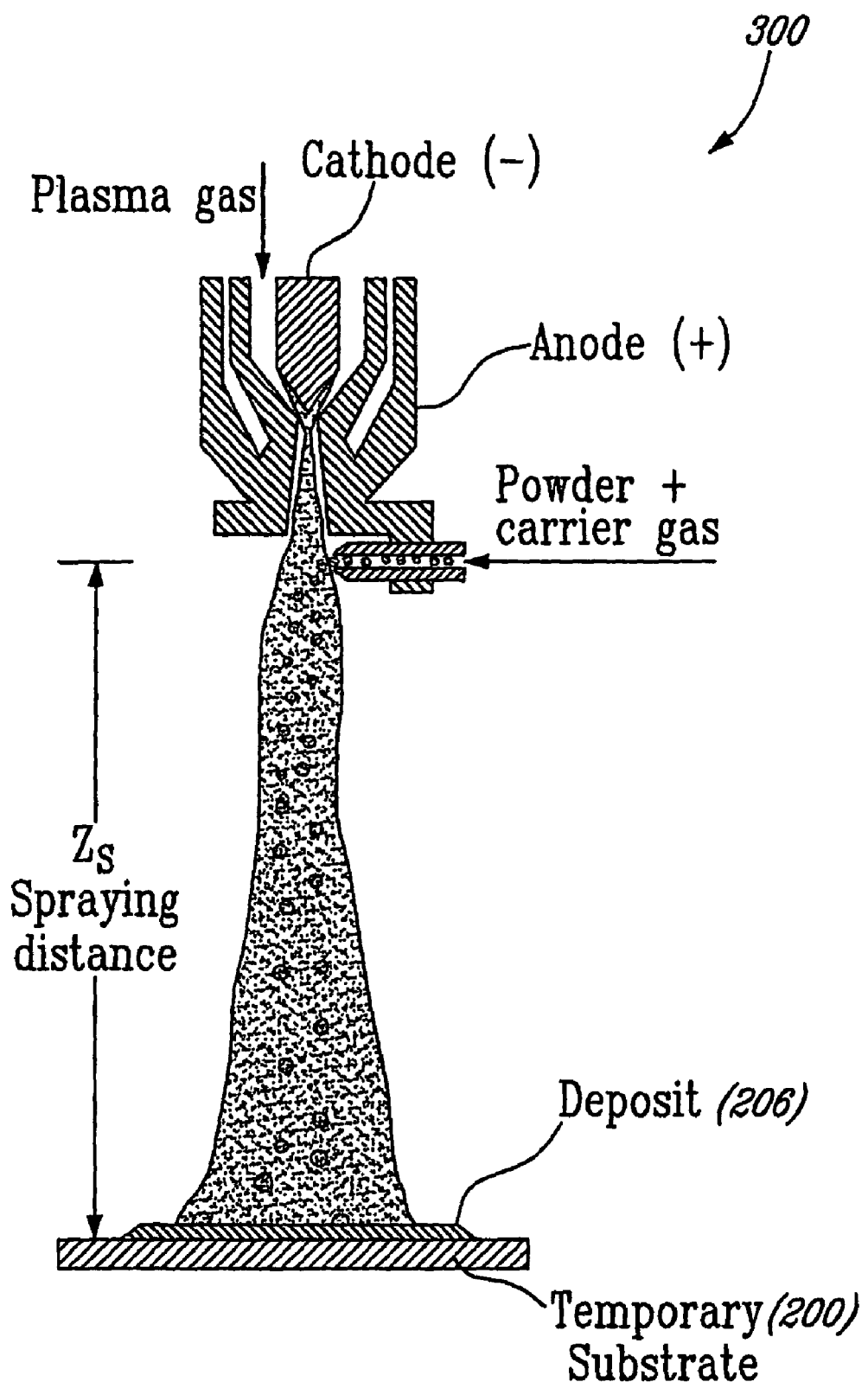
FIG. 5 is a schematic sectional view of a d.c. plasma apparatus according to a first illustrative embodiment of a plasma apparatus allowing to perform the plasma deposition step from the process of FIG. 1.

A first illustrative example of such a plasma apparatus, in the form of a direct current (d.c.) plasma jet 300, is shown in FIG. 5.

Using the plasma jet 300, steps 106-108 from the method 100 are performed by injecting the target material in powder form into a d.c. plasma jet under atmospheric or vacuum deposition conditions. The individual powder particles are molten, in-flight, and are accelerated towards the substrate 200 on which they impact forming a flat splat of the target material 206. The coating 206 is built up through the successive deposition of those splats until the required deposit thickness is reached. The deposit quality, in terms of purity and apparent density, depends on the purity of the feed material and the deposition conditions such as, the plasma torch-to-substrate distance $Z_S$, the substrate temperature, plasma gas compositions and plasma power. Typical operating conditions for such an apparatus 300 operating under vacuum deposition conditions are:
- plasma gas flow rate=40 to 50 slpm;
- plasma gas composition=Ar/H$_2$ with 10 to 20% vol. H$_2$;
- plasma power=30-40 kW;
- deposition chamber pressure=50 to 100 Torr;
- plasma substrate deposition distance=10 to 20 cm;
- powder feed rate=10 to 20 g/min; and
- powder mean particle diameter=30 to 50 micrometers.

Figure 6:
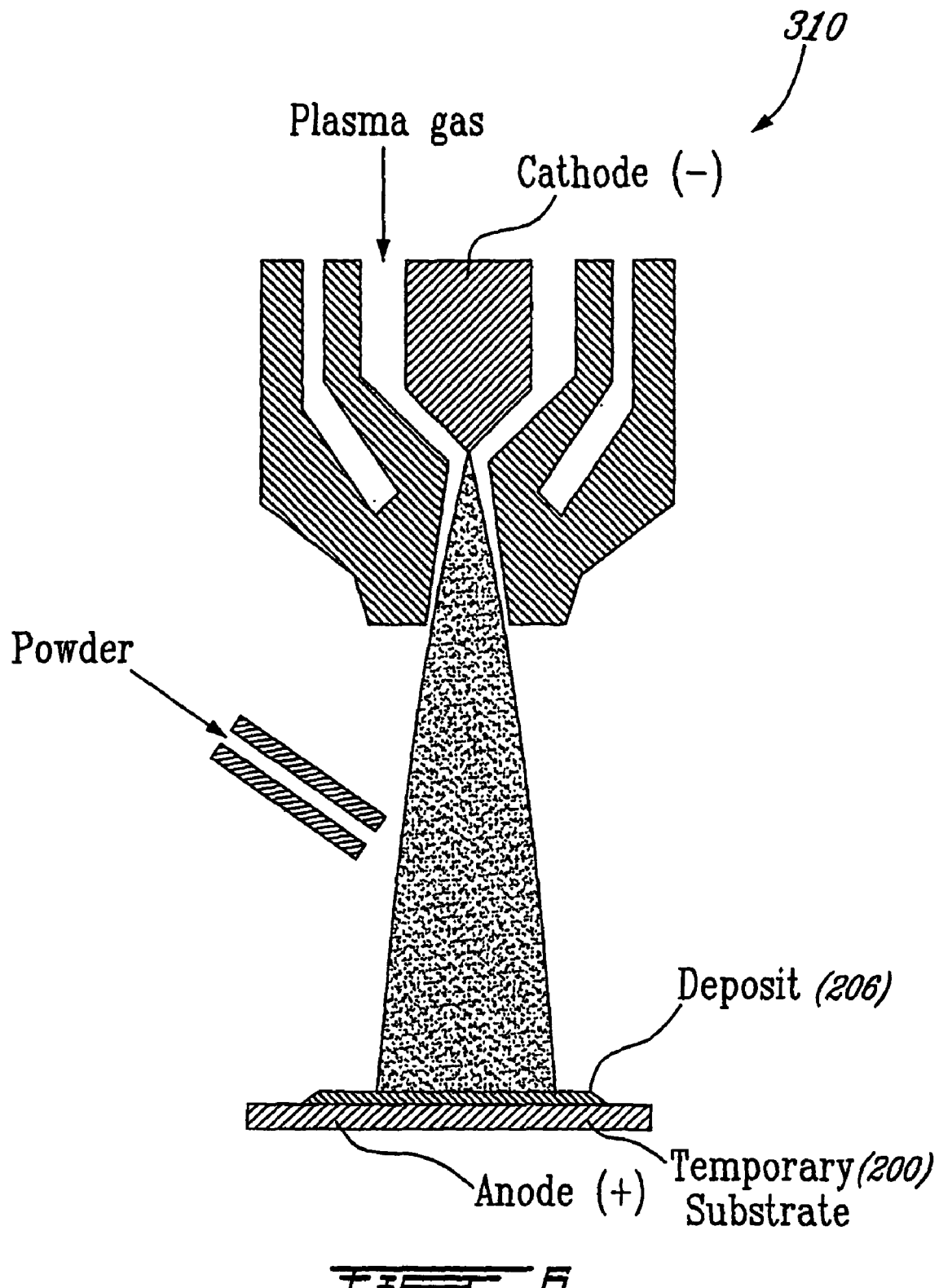
FIG. 6 is a schematic sectional view of a d.c. transferred arc according to a second illustrative embodiment of a plasma apparatus allowing to perform the plasma deposition step from the process of FIG. 1.

FIG. 6 illustrates a second illustrative example of a plasma apparatus 310 in the form of a d.c. plasma transfer arc. Since, the d.c. plasma arc apparatus 310 is very similar to the d.c. plasma jet apparatus 300 from FIG. 5, only the differences between the two apparatuses will be described herein in more detail.

With the d.c. transferred arc apparatus 310, the transfer of the plasma arc is achieved between the plasma torch cathode and the substrate 200, which act in this case as the anode. This technique is more prone to target material contamination by the substrate material 200, though higher target material densities are generally achieved using this technique.

Figure 7:
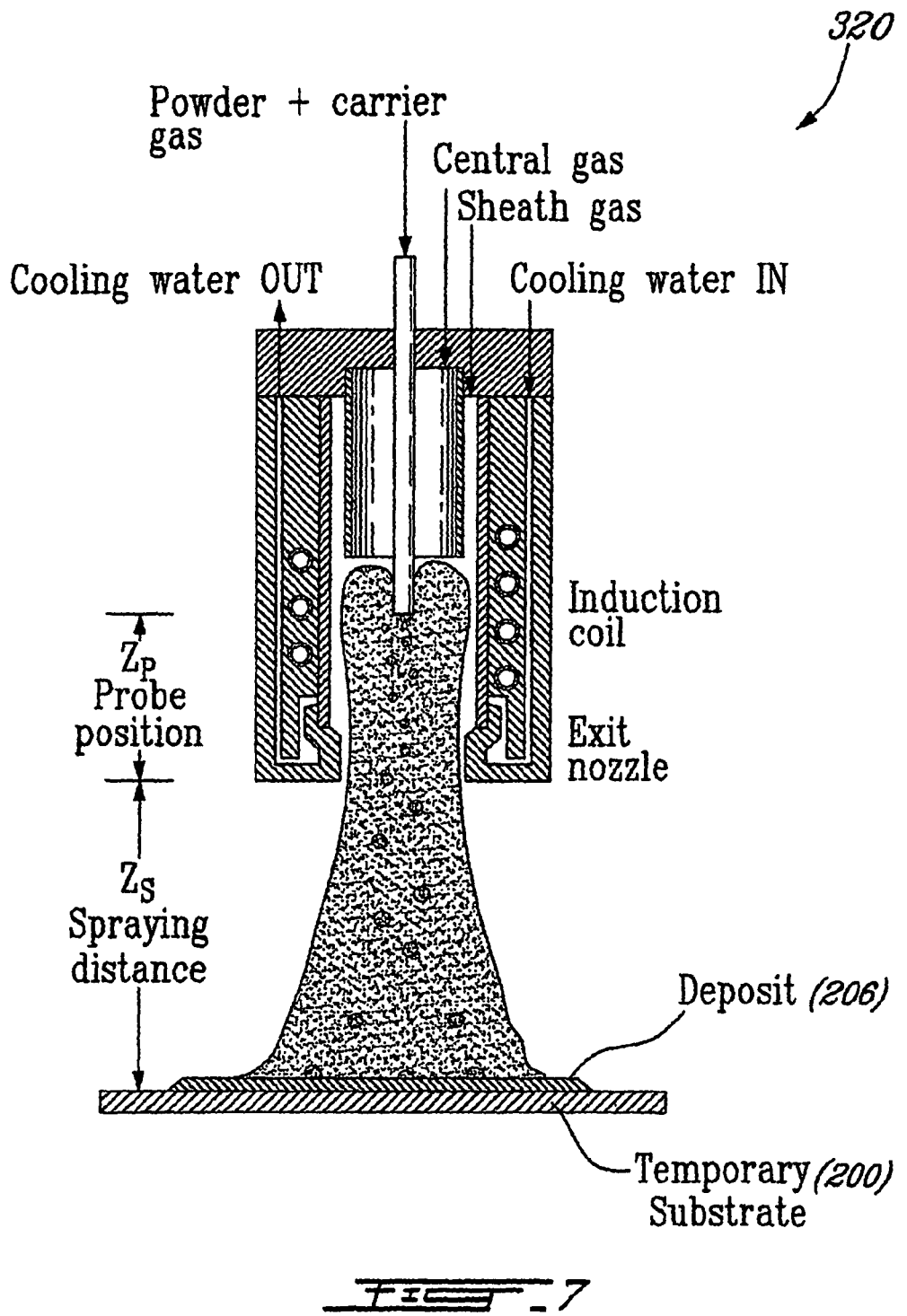
FIG. 7 is a schematic sectional view of a r.f. induction plasma apparatus according to a third embodiment of a plasma apparatus allowing to perform the plasma deposition step from the process of FIG. 1.

FIG. 7 illustrates a radio frequency (r.f.) induction plasma spraying apparatus 320 that can be used to perform steps 106-108 from the process 100. With this particular apparatus, the plasma jet is generated through the inductive electromagnetic coupling of the energy into the plasma gas, which guarantees a considerably higher level of purity of the plasma environment compared to d.c. plasma technology. The target material 206 in powder form is melted through, in-flight, heating by the plasma gas and is accelerated towards the substrate 200 on which the deposit 206 is built up through the successive formation of individual particle splats.

According to a more specific embodiment of vacuum induction plasma spraying, the induction plasma torch is mounted on the top of an appropriate vacuum deposition chamber with the plasma jet directed vertically downwards. The substrate 200 on which the target material 206 is to be deposited is placed inside the vacuum deposition chamber, mounted on a translating and rotating mechanism (not shown), which allows the substrate 200 to be maintained in a near right angle orientation with respect to the direction of the plasma jet. According to this specific embodiment of the vacuum induction plasma spraying apparatus, the motion of the substrate 200 is set in such a way as to maintain a fixed deposition distance between the exit nozzle of the plasma torch and the substrate surface. While the size and shape of the individual splats formed depend on the particle diameter, its temperature and velocity prior to impacting on the substrate, the deposition thickness depends on the relative speed between the substrate and the plasma torch. The microstructure of the formed deposit depends, in turn, on the particle parameters prior to their impact on the substrate and the substrate conditions. It has been found that the substrate temperature, its linear velocity and angle of impact of the particles on the substrate influence the properties of the deposits 206 obtained.

Typical operating conditions of an inductively coupled r.f plasma deposition step using a PL-50 Tekna induction plasma torch are as follows:
- plasma gas flow rates;
- Sheath gas=90 slpm (Ar)+10 slpm (H$_2$);
- Central gas=30 slpm (Ar);
- Powder gas=9 slpm (He);
- plasma plate power=80 kW;
- chamber pressure=100 Torr;
- powder feed rate=30-40 g/min;
- powder material=silicon;
- powder particle size distribution=40-90 micrometers;
- plasma torch-to-substrate distance=20 cm;
- substrate rotation=20 rpm; and
- total deposition time=30 min.

Figure 8:
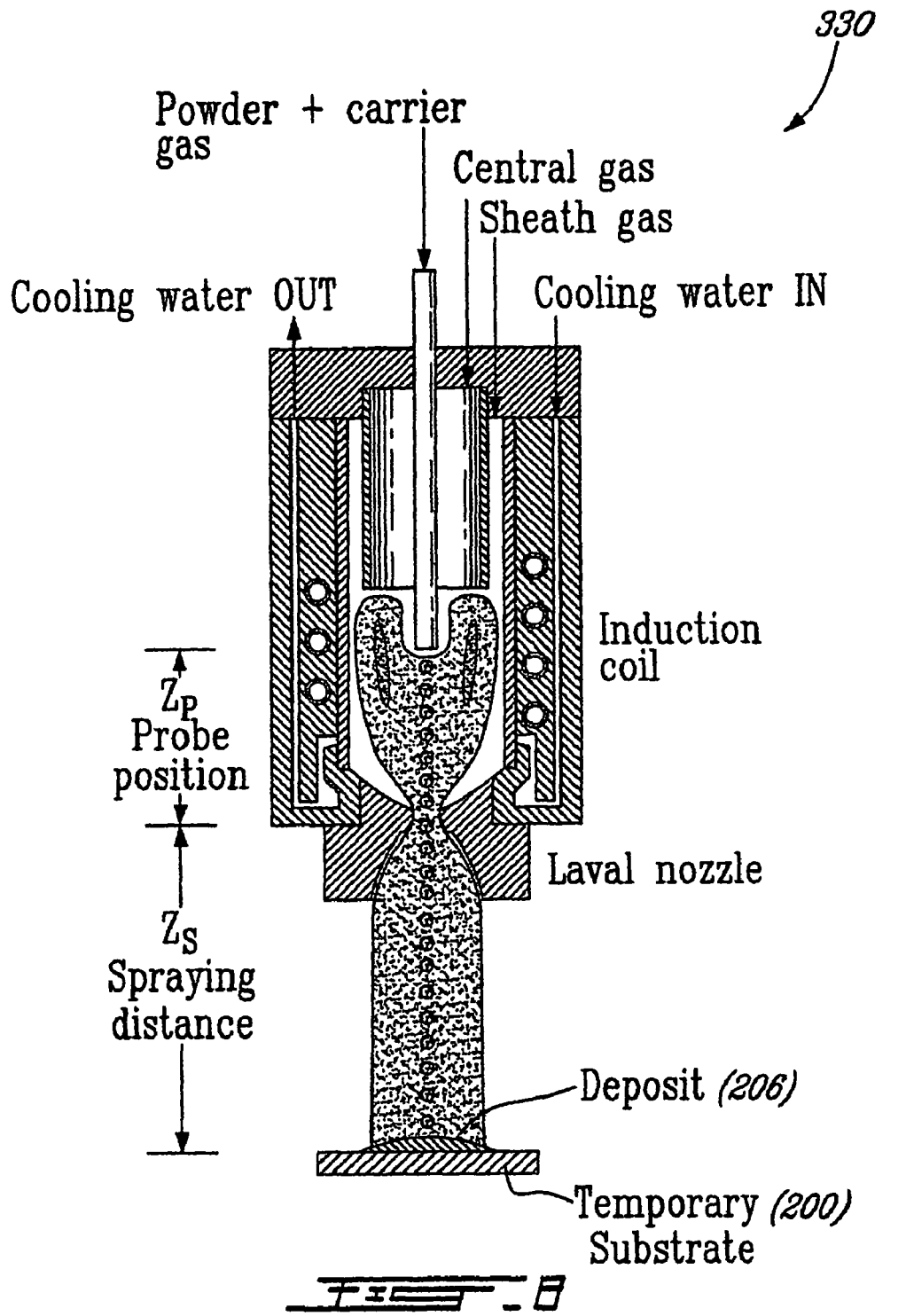
FIG. 8 is a schematic sectional view of a supersonic r.f. induction according to a fourth embodiment of a plasma apparatus allowing to perform the plasma deposition step from the process of FIG. 1.

FIG. 8 illustrates a radio frequency (r.f.) induction plasma spraying apparatus 330 similar to the apparatus 320 in FIG. 7 with the addition of a Laval contraction/expansion nozzle, which allows for a significantly increase to the velocity of the particles prior to their impact on the substrate 200 and gives rise to the formation of a deposit 206 with a significantly finer grain structure compared to that obtained using subsonic plasma deposition conditions (see FIG. 7). Nanostructured coating can also be generated using the plasma apparatus 330 through the use of nanosized feed powder.

Experiments have been conducted to demonstrate the possibility of using the process and apparatus from the present invention for the manufacture of silicon sputtering targets, through the vacuum induction plasma deposition of silicon powder on a graphite substrate. These experiments showed that target densities in excess of 99% of the theoretical density of elemental silicon could be obtained with a relatively uniform deposit thickness profiles, and a fine grain microstructures as can be seen on FIGS. 9-11.

Figure 9:
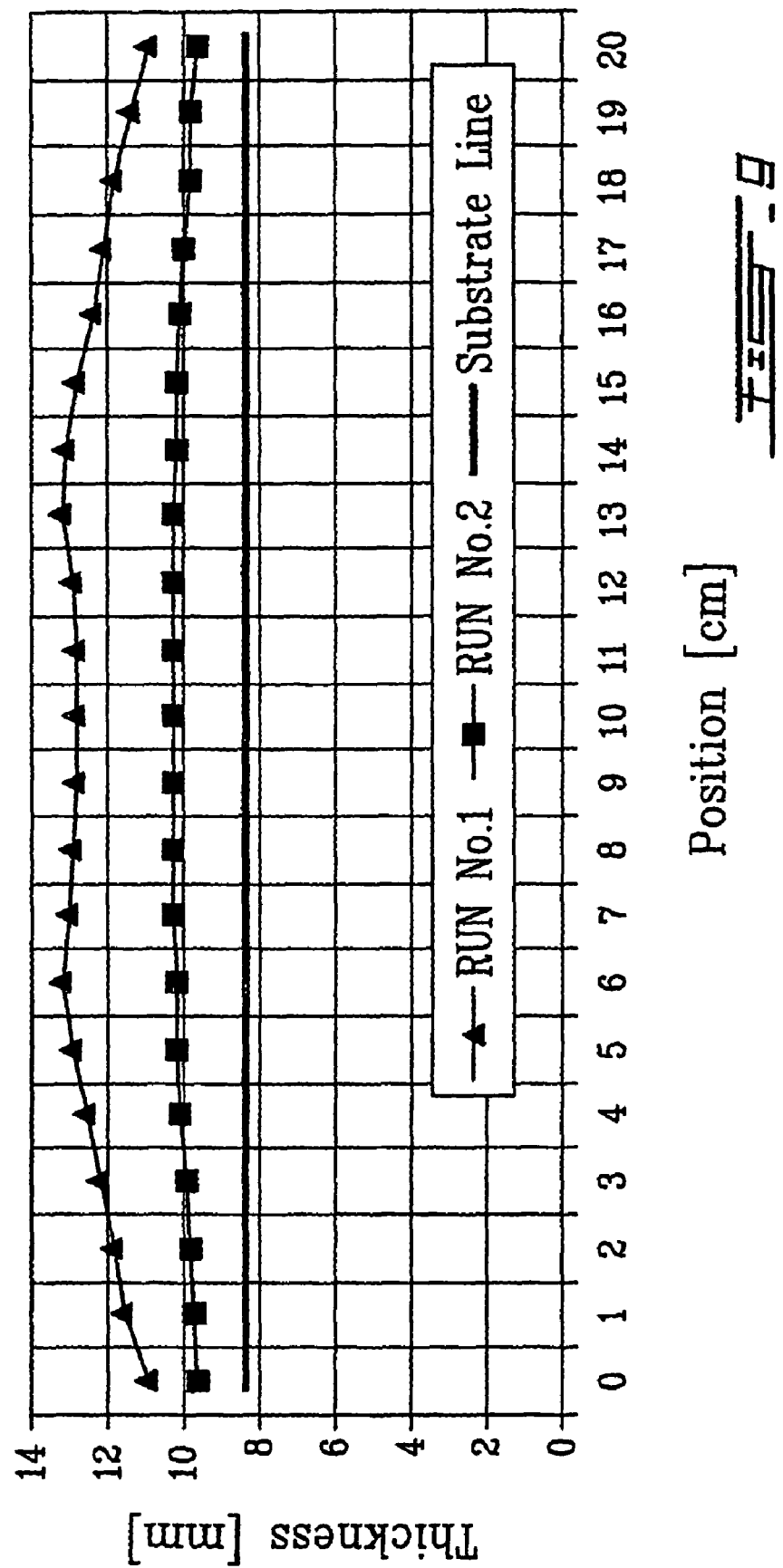
FIG. 9 is a graph of radial profiles of silicon target material deposited on a graphite temporary substrate for two experimental runs (no. 1 and no. 2)

FIG. 9 shows the radial profile of the silicon target material deposited on a 20 cm graphite substrate for two different experimentation runs.

Figure 10B:
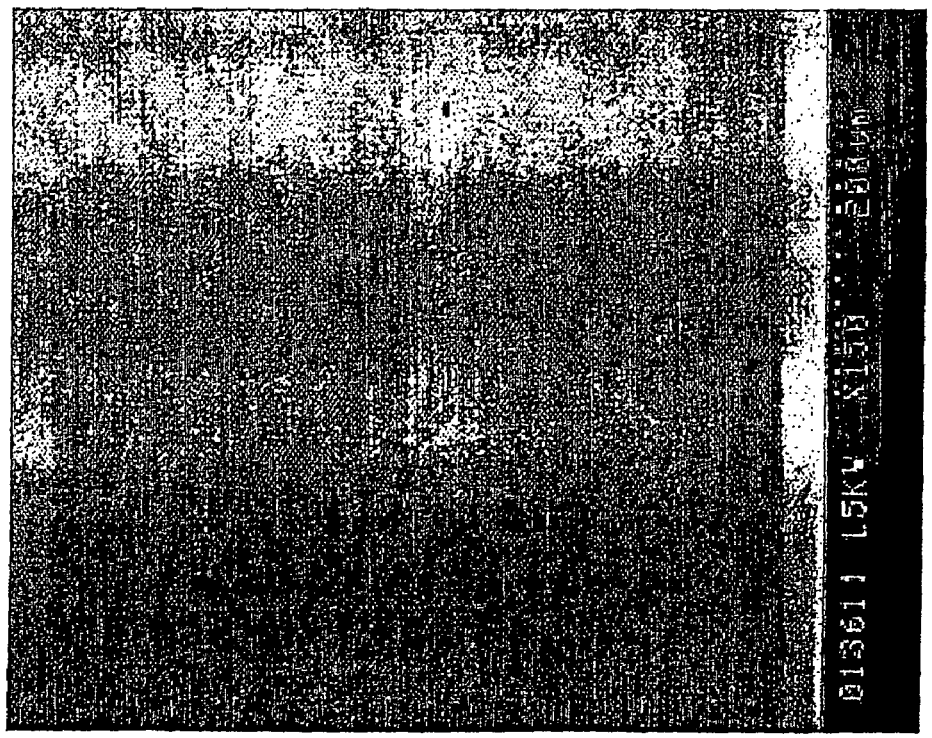
FIGS. 10a and 10b are electron micrographs of the deposited material for experimental runs no. 1 and no. 2.
Figure 10A:
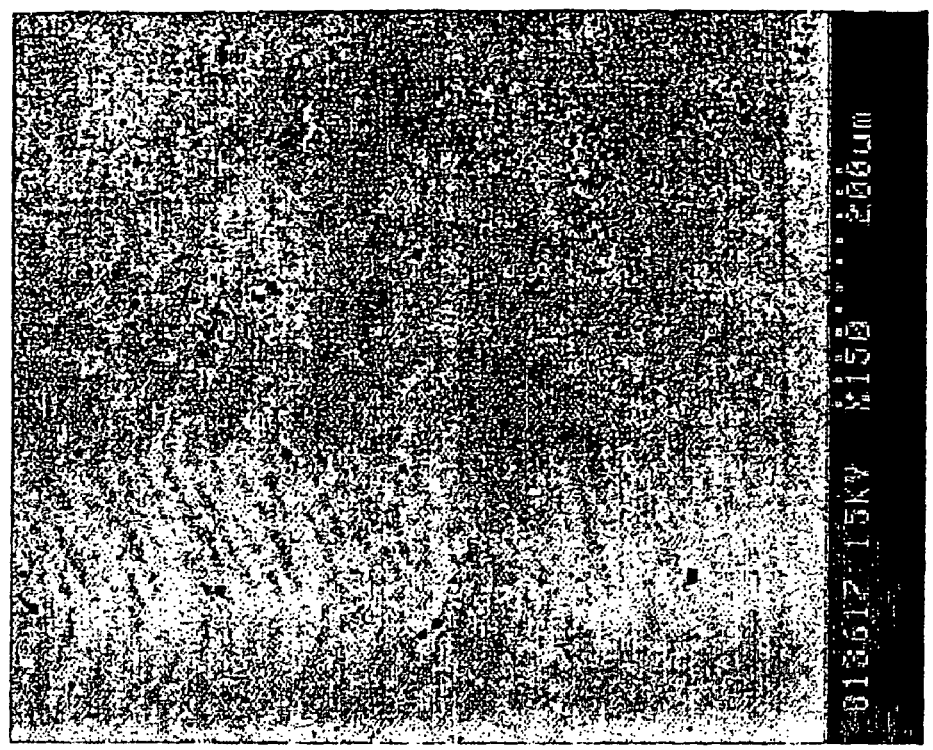

FIGS. 10a and 10b are electron micrographs of the deposited material resulting from respectively run no. 1 and run no. 2.

Figure 11:
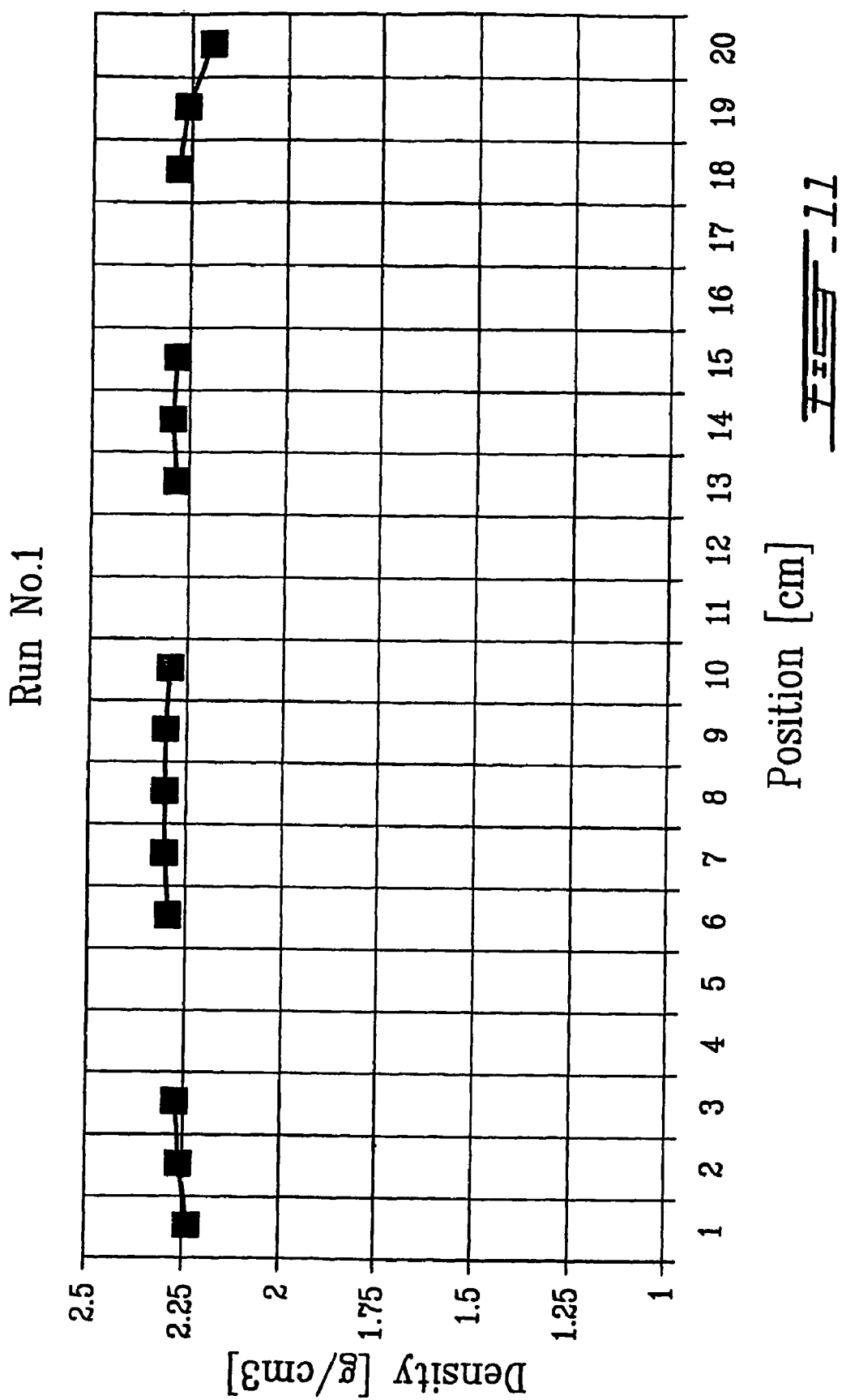
FIG. 11 is a graph of apparent density profile for the silicon deposit following experimental run no. 1.

Finally, FIG. 11 illustrates the apparent density profile for the silicon deposit for the run no. 1. It is to be noted that the theoretical density of silicon is 2.33 g/cm$^3$.

Although the present invention has been described hereinabove by way of preferred embodiments thereof, it can be modified without departing from the spirit and nature of the subject invention, as defined in the appended claims.

What is claimed is:

1. A process for the manufacture of a sputtering target comprising:
   i) providing a temporary substrate having a coating-receiving surface, wherein said temporary substrate is made of substrate material selected from the group consisting of a refractory metal, a ceramic, and a carbon-based composite material;
   ii) plasma melting in-flight of a target material selected to form the sputtering target in powder form, yielding droplets of molten target material;
   iii) deposition of said droplets onto said coating-receiving surface of said temporary substrate, yielding a sputtering target comprised of a coated layer of said target material on said coating-receiving surface of said temporary substrate;
   iv) joining said temporary substrate via said coated layer to a permanent target backing material; and
   v) removing said temporary substrate, yielding a sputtering target comprised of said coated layer of said target material on said permanent target backing material.

2. A process as recited in claim 1, wherein said temporary substrate is a used and depleted target.

3. A process as recited in claim 1, wherein said temporary substrate includes stress relief features.

4. A process as recited in claim 3, wherein said stress features are in the form of spiral or radial cuts.

5. A process as recited in claim 1, further comprising performing a heat treatment of said coated layer prior to step iv).

6. A process as recited in claim 1, further comprising providing said coated layer with stress relieving markings prior to step iv).

7. A process as recited in claim 1, wherein said temporary substrate is pre-coated with a control layer; whereby, in operation, said control layer allowing for at least one of facilitating the removing of said temporary substrate in step v) and avoiding contamination of said coated layer by preventing diffusion between said temporary substrate and said coated layer.

8. A process as recited in claim 7, wherein said control layer is deposited onto said temporary substrate by sputtering or using a chemical vapor deposition technique.

9. A process as recited in claim 7, wherein said control layer is made of an inert material.

10. A process as recited in claim 1, wherein, in step iv), joining said temporary substrate via said coated layer to a permanent target backing material is done using at least one of soldering or epoxy.

11. A process as recited in claim 1, wherein, in step v), said temporary substrate is mechanically removed.

12. A process as recited in claim 11, wherein in step v), said temporary substrate is mechanically removed by machining and/or etching.

13. A process as recited in claim 1, wherein steps ii) and iii) are performed using a plasma apparatus selected from the group consisting of a direct current (d.c.) plasma jet, a d.c. plasma transfer arc, and a radio frequency (r.f.) induction plasma spraying apparatus.

14. A process as recited in claim 13, wherein said plasma apparatus is operated under atmospheric or vacuum deposition conditions.

15. A process as recited in claim 13, wherein said radio frequency (r.f.) induction plasma spraying apparatus includes a Laval contraction/expansion nozzle provided for operation of said r.f. induction plasma spraying apparatus under supersonic or hypersonic flow condition.

16. A process as recited in claim 1, wherein said refractory metal is molybdenum or tungsten.

17. A process as recited in claim 1, wherein said ceramic is selected from the group consisting of silica, alumina, zirconia, silicon nitride, silicon carbide, and boron nitride.

18. A process as recited in claim 1, wherein said carbon-based composite material is graphite.

19. A process as recited in claim 1, wherein said temporary substrate is a generally flat disk.

20. A process for the manufacture of a sputtering target comprising:
   i) providing a substrate having a coating-receiving surface;
   ii) plasma melting in-flight of a target material selected to form the sputtering target in powder form, yielding droplets of molten target material; and
   iii) deposition of said droplets onto said coating-receiving surface of said substrate, yielding a sputtering target comprised of a coated layer of said target material on said coating-receiving surface of said substrate,
   wherein steps ii) and iii) are performed using a d.c. plasma transfer arc wherein said substrate acts as the anode.

* * * * *